(12) United States Patent
Dokumaci et al.

(10) Patent No.: US 6,645,867 B2
(45) Date of Patent: Nov. 11, 2003

(54) STRUCTURE AND METHOD TO PRESERVE STI DURING ETCHING

(75) Inventors: Omer H. Dokumaci, Wappinger Falls, NY (US); Bruce B. Doris, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/864,974

(22) Filed: May 24, 2001

(65) Prior Publication Data

US 2002/0175146 A1 Nov. 28, 2002

(51) Int. Cl.[7] .............................................. H01L 21/301
(52) U.S. Cl. ........................................ 438/700; 438/724
(58) Field of Search ................................. 438/424, 425, 438/427, 700, 702, 724, 958

(56) References Cited

U.S. PATENT DOCUMENTS

| | | | | |
|---|---|---|---|---|
| 4,583,281 A | * | 4/1986 | Ghezzo et al. ...... | 148/DIG. 114 |
| 5,891,959 A | * | 4/1999 | Kunz .................... | 525/107 |
| 5,918,131 A | * | 6/1999 | Hsu et al. ............. | 438/296 |
| 5,923,992 A | * | 7/1999 | Spikes et al. ......... | 438/424 |
| 5,940,717 A | * | 8/1999 | Rengarajan et al. . | 148/DIG. 50 |
| 6,187,666 B1 | * | 2/2001 | Singh et al. .......... | 438/633 |
| 6,297,126 B1 | * | 10/2001 | Lim et al. ............. | 438/424 |
| 6,355,531 B1 | * | 3/2002 | Mandelman et al. . | 438/276 |
| 6,429,473 B1 | * | 8/2002 | Cronin et al. ........ | 257/296 |

* cited by examiner

*Primary Examiner*—Kin-Chan Chen
(74) *Attorney, Agent, or Firm*—F. Chau & Associates, LLP

(57) ABSTRACT

Disclosed is a method of protecting a semiconductor shallow trench isolation (STI) oxide from etching, the method comprising lowering, if necessary, the upper surface of said STI oxide to a level below that of adjacent silicon active areas, depositing a nitride liner upon said STI oxide and adjacent silicon active areas in a manner effective in defining a depression above said STI oxide, filling said depression with a protective film, and removing said nitride layer from said adjacent active areas.

18 Claims, 4 Drawing Sheets

STRUCTURE AND METHOD TO PRESERVE STI DURING ETCHING

BACKGROUND OF THE INVENTION

1. Field of the Invention

This invention relates to the manufacture of semiconductor devices, particularly to a method and of protecting a single trench isolation oxide from etching during epitaxial precleaning and the semiconductor structure formed thereby.

2. Discussion of the Related Art

The etching of shallow trench isolation (STI) oxides during selective epitaxial precleaning for raised source-drain applications presents a problem in thin silicon-on-insulator (SOI) and other technologies. Cleaning the Si surface prior to epitaxial growth is critical to the quality of the growth of the epitaxial layer. This is important because the device performance is strongly dependent on the eptiaxial film quality. Typically, the cleaning process involves the removal of surface contamination and also involves Si surface passivation by hydrogen termination to prevent contamination from adsorbing onto the surface prior to epitaxial growth. Pre-silicide cleaning also has strict requirements. In order to create high quality silicide without defects, it is necessary to clean and also to hydrogen passivate the Si surface. Standard cleaning and hydrogen passivation chemistries include hydrofluoric acid (HF), which, in addition to cleaning Si, causes the unwanted etching of STI. In order to clean the Si surface adequately for epitaxial growth or silicide formation, the STI is excessively etched. This is particularly problematic for thin Si SOI applications. The reason for this is that the STI thickness is directly proportional to the Si thickness and will therefore be thin for thin Si SOI. During the pre-epitaxial growth cleaning and or the pre-silicide cleaning, the entire STI may be etched. After the STI is gone, the Buried Oxide (BOX) layer begins to etch. The BOX is located directly under the active area and as the BOX etches away, it can undercut the active area. When the undercutting is excessive, the active area may peel away completely, thereby ruining the device.

Conventional STI is created by first forming a pad oxide layer on the Si substrate, then SiN is deposited and patterned by lithography and etching. The SiN is used as a hard mask to etch trenches in the Si, then a thin SiO2 liner is formed by thermal oxidation. Finally, the STI oxide is deposited and chemical mechanical polishing (CMP) used to remove silicon oxide from areas outside the shallow trench. To avoid the possibility of excessive STI etching during pre-epitaxial or pre-silicide cleaning, one solution is to deposit a protective nitride liner inside the trench after the formation of the oxide liner but before the STI fill deposition. There are two main disadvantages to this method. The first problem is that the upper part of the nitride liner will get etched during removal of the pad nitride layer, resulting in a divot adjacent to the active region. The divot is subsequently filled with polysilicon during gate polysilicon deposition and the polysilicon in the divot can cause unwanted electrical connections between adjacent gates and also create a so-called "wraparound" gate. The wraparound gate results in a lowering of the threshold voltage, which causes premature activation of the transistors. The second problem is that a nitride layer cannot protect any STI oxide on top of it. All of the STI oxide above it can be etched away, thereby compromising planarity. What is needed is a method of protecting the shallow trench isolation (STI) during oxide etching processes.

SUMMARY OF THE INVENTION

Disclosed is a method of protecting a semiconductor shallow trench isolation (STI) oxide from etching, the method comprising lowering, if necessary, the upper surface of said STI oxide to a level below that of adjacent silicon active areas, depositing a nitride liner upon said STI oxide and adjacent silicon active areas in a manner effective in defining a depression above said STI oxide, filling said depression with a protective film, removing said nitride layer from said adjacent active areas.

In another aspect of the invention said deposition of a nitride liner is effected with a chemical vapor deposition.

In another aspect of the invention said chemical vapor deposition is one selected from a low pressure chemical vapor deposition, a rapid thermal chemical vapor deposition, a plasma-enhanced chemical vapor deposition, or a high-density plasma chemical vapor deposition.

In another aspect of the invention said chemical vapor deposition further comprises reacting a silane derivative with ammonia.

In another aspect of the invention said protective film is an organic polymer.

In another aspect of the invention said organic polymer is a planarizing polymer.

In another aspect of the invention said planarizing protective polymer is an anti-reflective coating polymer.

In another aspect of the invention said anti-reflective coating polymer is one selected from mixtures of acrylates and methacrylates, mixtures of polyurea and polysulfone polymers, and copolymers of benzophenone and bisphenol-A.

In another aspect of the invention said planarizing protective polymer is a photo-resist polymer.

In another aspect of the invention, said photo-resist polymer is a novolak resin.

In another aspect of the invention said protective film is a spin-on oxide.

In another aspect of the invention said protective film is conformal and is planarized by chemical mechanical polishing.

In another aspect of the invention said filling of said depression with protective film comprises depositing a layer of said protective film over said nitride layer, recessing said protective film such that said protective film remains only in said depression.

In another aspect of the invention said protective film is an organic polymer and said recessing is effected with a plasma etch.

In another aspect of the invention said protective film is removed from said depression.

In another aspect of the invention, said protective film is removed from said depression with a reactive ion etch.

Disclosed is a method of protecting a semiconductor shallow trench isolation (STI) oxide from etching, the method comprising lowering, if necessary, the upper surface of said STI oxide to a level below that of adjacent silicon active areas, executing a chemical vapor deposition to deposit a conformal nitride liner upon said STI oxide and adjacent silicon active areas in a manner effective in defining a depression above said STI oxide, covering said nitride liner with a protective film comprising an organic polymer, recessing said protective film with a plasma etch, such that said protective film remains only in said depression, removing said nitride layer from said adjacent active areas with a reactive ion etch, removing said protective film from said depression with a plasma etch.

Disclosed is a semiconductor structure, comprising a plurality of active areas separated by one or more shallow trench isolations wherein only said shallow trench isolations are covered by a protective layer of silicon nitride.

Disclosed is a semiconductor structure comprising a plurality of active areas separated by one or more shallow trench isolations, said active areas and shallow trench isolations covered by a layer of silicon nitride, wherein said layer of silicon nitride comprises depressions over said shallow trench isolations, a protective film disposed in said depressions.

Disclosed is a method of protecting a semiconductor shallow trench isolation (STI) oxide from etching, the method comprising providing means for lowering, if necessary, the upper surface of said STI oxide to a level below that of adjacent silicon active areas, providing means for depositing a nitride liner upon said STI oxide and adjacent silicon active areas in a manner effective in defining a depression above said STI oxide, providing means for filling said depression with a protective film, providing means for removing said nitride layer from said adjacent active areas.

DETAILED DESCRIPTION OF PREFERRED EMBODIMENTS

Figure 1:
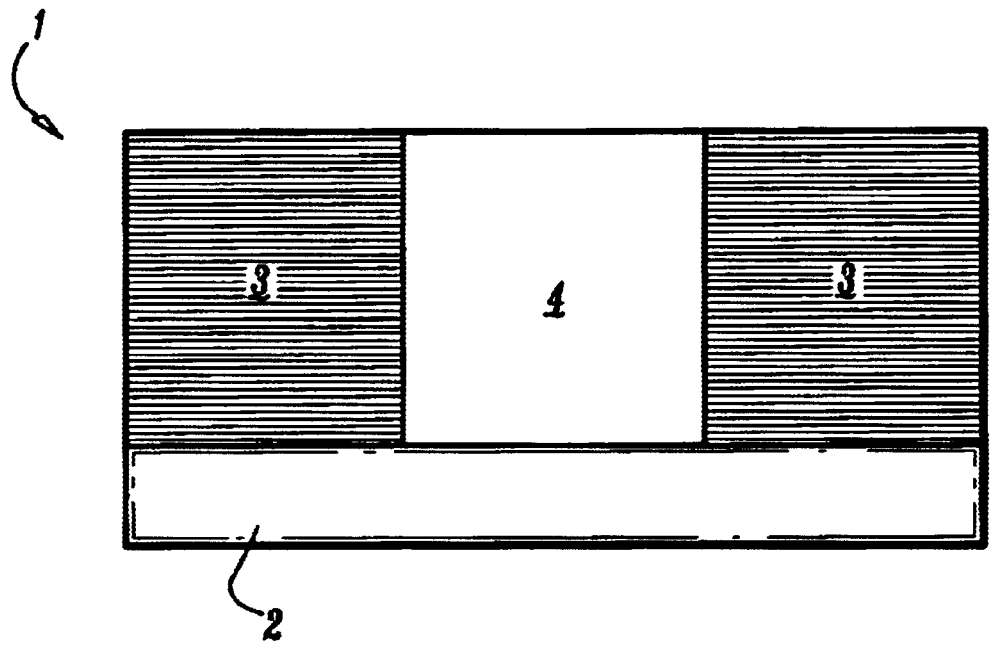
FIG. 1 shows a typical starting STI structure.

Referring to FIG. 1, there is shown in cross section a typical starting structure, namely a silicon wafer 1 comprising, usually, a buried oxide layer (BOX) 2, though this layer could be any suitable semiconductor material (such as plain silicon, for example), an active area 3 structure defining one or more shallow trenches filled with an insulating oxide 4, thereby isolating the active areas 3 on either side of the trenches from one another.

Figure 2:
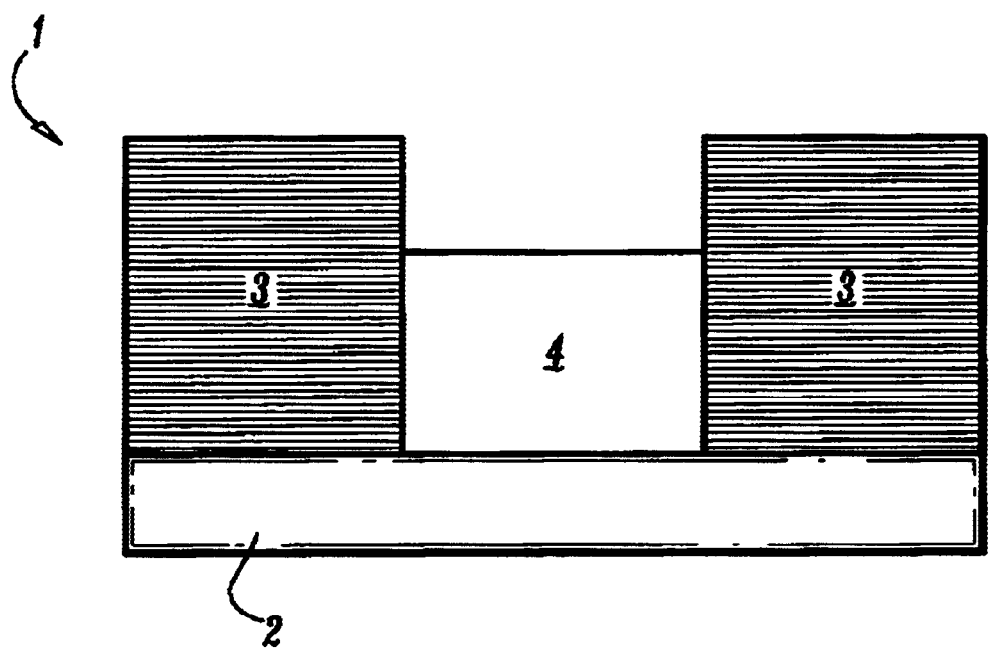
FIG. 2 shows the result of an oxide etching process.

Referring to FIG. 2, if the insulating oxide 4 is not already below the level of the adjacent active areas 3, then it is desirable to etch the STI oxide down to a level below them, as shown in the drawing. The purpose of this is to define a depression over the STI oxide after deposition of a nitride liner.

Any etching method that does not harm the adjacent active areas is sufficient, such as an HF etch or a dry plasma process that is selective to polysilicon. Suitable gases for use in a dry etching plasma process for etching silicon oxides at a more rapid rate than polysilicon include $CF_4$—$O_2$ and $CF_4$—$H_2$ mixtures, wherein the percentage of $CF_4$ in these mixtures is generally no greater than 80%, more preferably no greater than 60%, and most preferably about 50%±10%. Substantially pure fluorocarbon plasmas, such as $C_2F_6$ may also be utilized.

Generally, the plasma etching process will be carried out in an etching chamber that may have either or both of plasma enhanced (PE) or reactive ion etch (RIE) capabilities. PE-type etches will generally be conducted at pressures above 100 torr, while RIE etches will generally be below that pressure. The etches may be performed in batch chambers, such as with barrel etchers, parallel electrode reactors, or hexode etchers. Larger wafers, generally those not smaller than about 200 mm diameter may benefit from single-wafer etchers.

Figure 3:
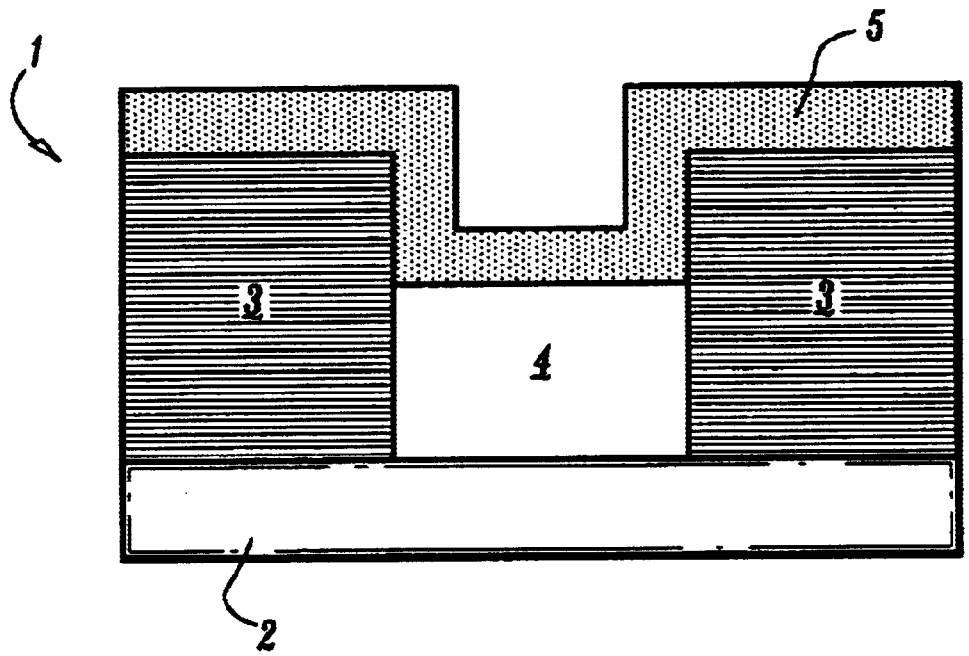
FIG. 3 shows the result of a nitride deposition.

Referring to FIG. 3, a silicon nitride liner 5 is then deposited over the wafer. Optionally, an oxide layer (not shown) may be deposited or grown over the wafer and the nitride layer deposited thereon so as to protect the silicon surface of the active areas from the stress caused by the nitride layer. The deposition is preferably done in a manner effective in defining a depression over the STI oxides, hence the technique should be conformal to the topography of the lowered STI oxide.

Typical methods for conformal deposition of the silicon nitride liner are chemical vapor deposition (CVD) techniques, such as low pressure (LPCVD), rapid thermal (RTCVD), and plasma enhanced (PECVD) chemical vapor depositions. High density plasma deposition (HDP-CVD) techniques may also be used to perform this operation.

LPCVD silicon nitride films may generally be formed by reacting dichlorosilane ($SiCl_2H_2$) with ammonia ($NH_3$) at temperatures of from about 700âC–800âC to form a $Si_3N_4$ film and HCl and $H_2$ gasses. LPCVD films are desirable for their film uniformity and relatively low processing costs. The rate of LPCVD deposition is correlated to the ratio of the concentration (i.e., partial pressure) of dichlorosilane with respect to that of ammonia. LPCVD depositions are typically carried out in a hot-wall tube reactor at pressures of from about 0.25 to 2.0 torr.

LPCVD reactions will generally be carried out in a horizontal tube LPCVD batch reactor, also known as a "hot-wall" tube reactor, which are desirable for their good economy, throughput, uniformity, and ability to accommodate even large diameter wafers. Such reactors comprise a tube, usually quartz, equipped with vacuum producing and heating means, through which the reactive gasses are passed. If the configuration is such that the reactive gasses are introduced at one end so as to flow down the length of the tube, then it is generally desirable to provide temperature ramp means so as to establish a temperature gradient along the length of the tube. This is because the wafers at the source of the gas flow will have the benefit of a higher concentration of the reactive gasses and will therefore display higher rates of silicon nitride deposition than those wafers downstream. This can be compensated for by increasing the rate of reaction by increasing temperature downstream. Alternatively, the reactive gasses may be injected into the chamber through a plurality of openings substantially evenly distributed along the length of the reaction chamber. Another method of compensating for the depletion of reactant gasses along the length of the tube is to increase the rate of gas flow.

RTCVD silicon nitride films may generally be formed by the reaction of dichlorosilane and ammonia by reacting the gasses in a furnace in which the temperature of the wafer is rapidly ramped to temperatures as high as 1100âC within about five seconds. Temperature ramping rates from 50âC/sec to about 75âC/sec are typically achieved in most small batch fast ramp (SBFR) furnaces and some of the latest models achieve rates as high as 150âC/sec.

RTCVD methods are desirable for their rapid processing and ability to handle large wafers of 300 nm and larger, among other advantages. Also, the use of higher temperatures over shorter periods of time reduces undesirable transient-enhanced diffusion effects.

Rapid thermal process (RTP) furnaces are commercially available from such companies as Applied Materials and AG Associates, among others. Preferred RTP systems will maintain uniform temperature across the width of the wafer during the rapid ramping-up and cooling down of temperature and will have an accurate means of measuring the wafer temperature so as to control it. A typical Applied Materials RTP will have a water-cooled reaction chamber, an array of heating lamps, such as halogen lamps, and a fiber optic temperature probe. The halogen lamps will generally be arrayed above the wafer and have their light directed downward by collimating light pipes, often with a quartz or fused silica window separating the lamps from the reaction chamber. This allows rapid heating and the ability to isolate the chamber so as to evacuate it. The wafer sits upon an insulative rotating base, the rotation effective in smoothing out any gas flow and light variations. Pyrometers are usually mounted below the wafer and measure temperature radiating off the back of the wafer at regular intervals, typically 20 times per second, thereby allowing precise computer control over the ramp-up and cool-off of the wafer.

PECVD silicon nitride films may generally be formed by reacting silane gas ($SiH_4$) with either ammonia ($NH_3$) or nitrogen ($N_2$) gas in the presence of electromagnetic radiation in the radio frequency range, thereby depositing a polymer-like Si—N—H material. Reaction temperatures will typically be from 200âC to 400âC at 0.2 to 0.3 torr and rf-frequencies of from 0.3 to 13.56 MHz. Dual frequency systems, typically combining a high frequency (e.g., about 13.5 MHz) rf-signal with a low frequency (e.g., 0.3 to 0.5 MHz) rf-signal to control film stress associated with SiN films. When using ammonia gas, the ratio of ammonia to silane will typically be from about 5 to about 20 parts ammonia to silane. When using nitrogen, 100 to 1,000 parts nitrogen to silane are will typically be used. Generally, PECVD films made with ammonia will display better conformalty than those made with nitrogen.

Three types of PECVD reactors are in wide use, namely parallel-plate batch reactors, mini-batch radial reactors, and single wafer reactors.

Parallel-plate batch reactors have, as the name implies, a set of parallel plates. The reactor is generally in the form of a vertical cylinder with one plate at the bottom and the other at the top. The wafers rest on the bottom plate, which can usually be rotated and heated and the rf-signal is applied to the electrodes.

A more popular PECVD reactor is the mini-batch radial reactors, which comprises a plurality of deposition stations wherein each a wafer sits upon a flat heated electrode. A showerhead-like electrode above each wafer dispenses the reactant gases. These types of reactors are favored for their high reaction rates and minimal contamination problems and good uniformity. Uniformity is achieved by moving the wafers from one station to another for additional depositions, rather than performing the entire deposition at once, thereby averaging out any anomalies at individual stations.

Single-wafer PECVD reactors, such as those sold by Applied Materials, will generally have multiple reactor chambers, each adapted to contain a single wafer. Each chamber is equipped with a base electrode upon which the wafer sits and a showerhead-like gas nozzle electrode, powered by the rf signal. Heating is usually achieved by a plurality of lamps that provide rapid radiant heating. Film stress may be controlled by adjusting the rf frequencies or the electrode gap size.

HDP-CVD silicon nitride films may generally be formed by reacting silane gas ($SiH_4$) with either ammonia ($NH_3$) or nitrogen ($N_2$) gas in the presence of electromagnetic radiation and an inert gas, such as Argon (Ar) or Helium (He). Generally, the reaction pressure will be rather low, generally below ten mTorr. HDP-CVD techniques are desirable for laying films down on high-aspect-ratio features.

HDP-CVD reactors will generally utilize a glow discharge to produce ions powerful enough to cause sputtering in the material being deposited. Glow discharges are a self-sustaining plasma produced by either or both of a dc-diode type system or an rf-diode system. An inert gas, such as Argon is introduced between a pair of electrodes with a strong enough electric field to ionize the reactant and inert gases to a plasma. Rf-diode systems are preferred because dc-diode systems are unable to sputter insulative materials like silicon nitride and exhibit slower deposition rates in most applications. A preferred rf-diode system will be equipped with a magnetron source so as to help confine electrons near the wafer surface. Commercially popular systems include those sold under the tradename "Centura" by Applied Materials.

Figure 4:
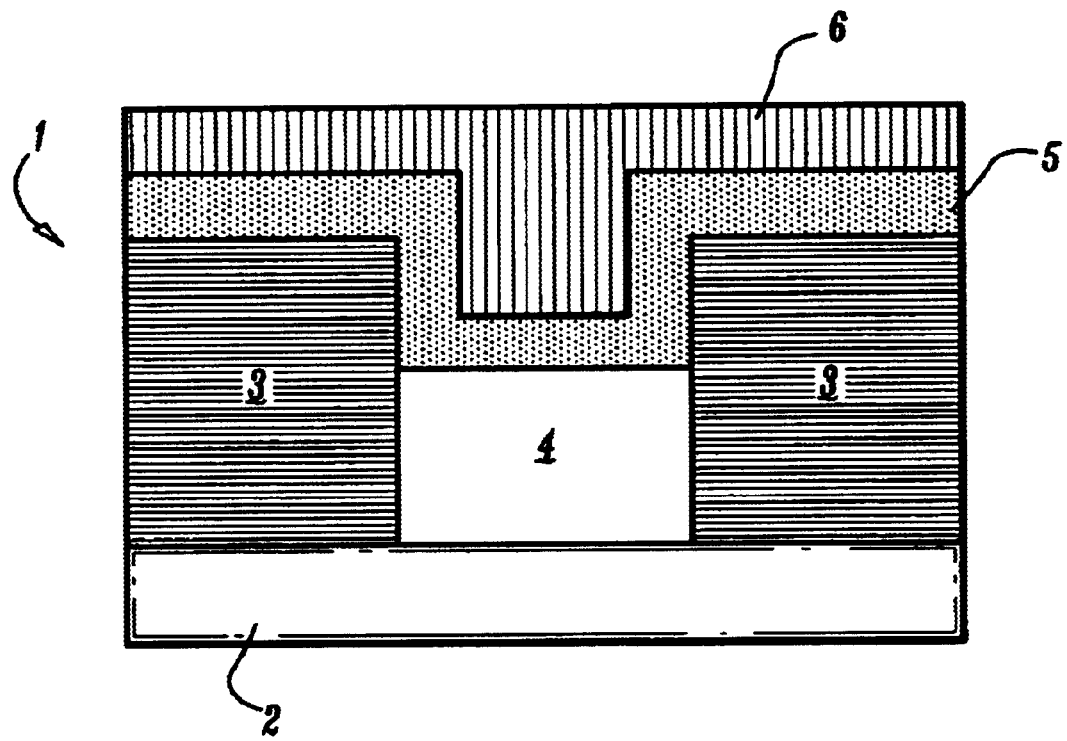
FIG. 4 shows deposition of a protective planarizing film.

Referring to FIG. 4, a protective film 6 is deposited. The protective planarizing film will preferably be any suitable polymer plastic that is planarizing (i.e., it fills up the depressions rather than conforming to the topography of the depressions the way a nitride CVD deposition does) and for which there exists a selective etch with respect to silicon nitride (i.e., an etch that will etch the polymer, but not silicon nitride). Commonly available and economical protective polymers are those sold for anti-reflective coatings and photo-resist layers in the lithographic arts, often referred to as "organic spin-on" polymers, which comprise polymer resins dissolved in solvent. Such resins will typically have molecular weights in the thousands or ten thousands as measured by gel permeation chromatography, but may even go into the millions. Novolak binder resins are commonly available and useful for use in the invention, such as are disclosed in Shiro et al., U.S. Pat. No. 5,674,657, the teachings of which are incorporated by reference herein in their entirety. A commonly used photoresist is sold under the designation "HPR-204" by Olin Hunt Specialty Products of New Jersey and comprises mixed meta- and para-cresol novolak binder resins and a napthaquinone-1,2-diazide-5-sulfonic acid triester of a trihydroxy benzophonene sensitizer dissolved in 85% by weight of ethyl cellusolve acetate, 8.6% by weight butyl acetate, and 5.2% by weight xylene, and 1.2% by weight ethyl benzene. Suitable antireflective coatings are co-polymers of benzophenone and bisphenol-A dissolved in an organic solvent, such as is described in Thomas et al., U.S. Pat. No. 6,207,787, the disclosures of which are incorporated by reference herein in their entirety. Other suitable antireflective coatings include, but are certainly not limited to, organic solutions of multifunctional acrylates and methacrylate monomers, and polyurea and polysulfone polymers. Conformal antireflective coating suitable for use with the invention are also sold under the tradenames "DUV 30" and "DUV 32" by Brewer Scienc, Inc. of Rolla, Mo. Photoresists and antireflective coatings may also be thinned or diluted by mixing in additional solvent, such as is described in Daraktchiev, I. S., U.S. Pat. No. 4,996,080, the disclosures of which are incorporated by reference herein in their entirety. Commercially available planarizing antireflective coatings suitable for use with the invention include those sold under the product designations "DUV 30" and "DUV 32", by Brewer Science, Inc. of Rolla, Mo.

It is also possible to use a spin-on oxide (e.g., glass spin-on) film for a protective film and then planarize it by chemical mechanical polishing (CMP). Alternatively, one may deposit a conformal organic film and also planarize by CMP. Conformal organic films are generally comprised of relatively high molecular weight resins, as high as 40,000 Daltons and above, dissolved in solvent, such as are described in Pavelick et al. U.S. Pat. No. 6,190,839 B1, the disclosures of which are incorporated by reference herein in their entirety. Commercially available conformal antireflective coatings suitable for use with the invention include those sold under the product designations "ARC 25", "DUV 44", and "DUV 42", also by Brewer Science, Inc. of Rolla, Mo., and those sold under the "AR" series trademark by Shipley Company, LLC of Marlborogh, Mass., particularly those designated "AR5" and higher, such as "AR7" and "AR14".

Of course, any polymer dissolved in a solvent that is sufficiently planarizing, adhering, and possessing the requisite selectivity will be suited to this invention. Photoresists and antireflective coatings are specifically cited for use with this invention because these materials are almost always readily at hand in any semiconductor fabrication facility.

Figure 5:
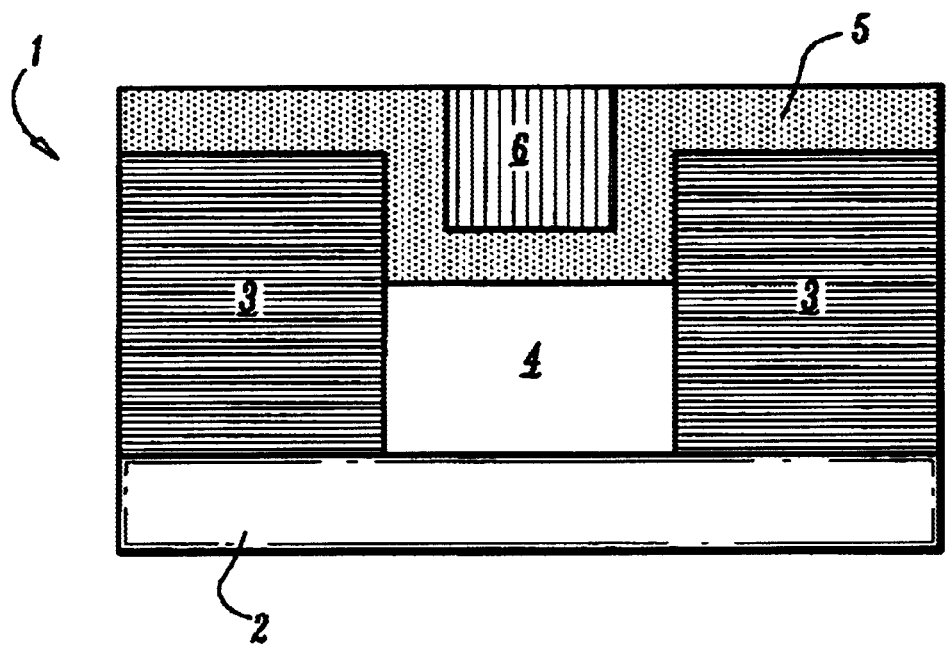
FIG. 5 shows the result of partially etching the protective planarizing film.

Referring to FIG. 5, the protective film 6 is recessed such that only that portion of the protective film 6 in the depressions over the oxide isolations 4 remain. In the case of an organic polymer protective film, this can be achieved with a plasma etch using oxygen and nitrogen gases in the presence of an rf-frequency.

Figure 6:
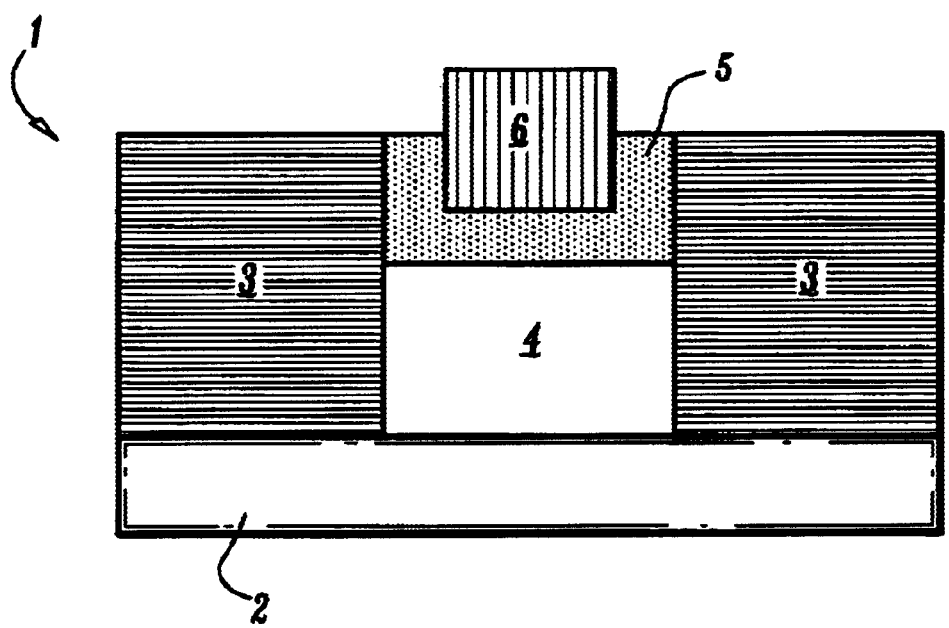
FIG. 6 shows the result of an etching operation.

Referring to FIG. 6, the exposed nitride (i.e., not protected by the arc) is etched away, preferably with a reactive ion etch (RIE), thereby revealing the active areas 3. Alternatively, a hot phosphoric or similar etch may be used, but this procedure is less controllable than a dry RIE etch.

An RIE etch of silicon nitride will generally utilize a $CF_4$—$O_2$ or $CHF_3$—$O_2$ gas mix, or $CH_2F_2$ or $CH_3F$ gasses, in the presence of an rf-frequency (e.g., 13.5 MHz) to establish a glow discharge. Typical reaction pressures are from about 7 to about 6000 mTorr.

Commercially available RIE systems for use in the invention include those sold under the "Etch Centura" tradename series by Applied Materials, among others. Such systems utilize a glow discharge and electrodes to combine the benefits of sputtering with those of enhanced plasma etching and produce high anisotropic etches.

Figure 7:
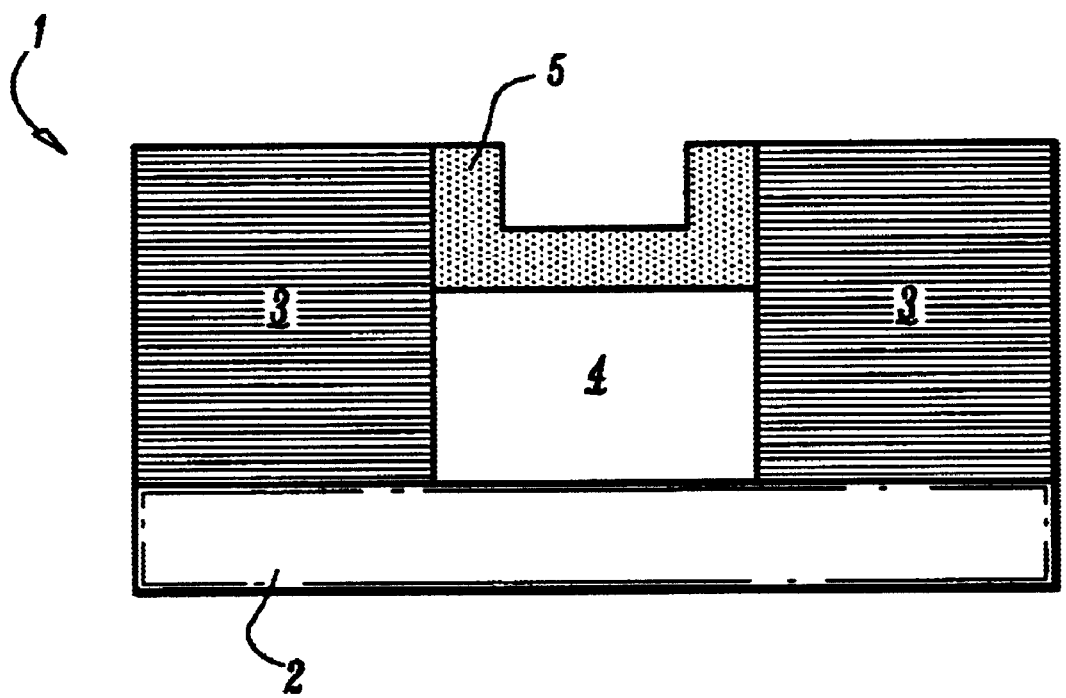
FIG. 7 shows the result of the removal of the planarizing film.

Referring to FIG. 7, the protective film 6 may then be etched away, leaving a trench oxide 4 covered by a protective nitride cap 5. The active areas may now be precleaned without fear of damage to the trench oxide 4.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of protecting a semiconductor shallow trench isolation (STI) oxide from etching, the method comprising:
   lowering, if necessary, the upper surface of said STI oxide to a level below that of adjacent silicon active areas;
   depositing a conformal nitride liner upon said STI oxide and adjacent silicon active areas in a manner effective in defining a depression above said STI oxide;
   filling said depression with a planarized protective film; and removing said nitride layer from said adjacent active areas.

2. The method of claim 1 wherein said deposition of a nitride liner is effected with a chemical vapor deposition.

3. The method of claim 2 wherein said chemical vapor deposition is one selected from the group: a low pressure chemical vapor deposition; a rapid thermal chemical vapor deposition; a plasma-enhanced chemical vapor deposition; or a high-density plasma chemical vapor deposition.

4. The method of claim 2 wherein said chemical vapor deposition further comprises reacting a silane derivative with ammonia.

5. The method of claim 1 wherein said protective film is an organic polymer.

6. The method of claim 5 wherein said organic polymer is a planarizing polymer.

7. The method of claim 6 wherein said planarizing protective polymer is an anti-reflective coating polymer.

8. The method of claim 7 wherein said anti-reflective coating polymer is one selected from the group: mixtures of acrylates and methacrylates; mixtures of polyurea and polysulfone polymers; and copolymers of benzophenone and bisphenol-A.

9. The method of claim 6 wherein said planarizing protective polymer is a photo-resist polymer.

10. The method of claim 9 wherein said photo-resist polymer comprises a novolak resin.

11. The method of claim 1 wherein said protective film is a spin-on oxide.

12. The method of claim 1, wherein said protective film is conformal and is planarized by chemical mechanical polishing.

13. The method of claim 1 wherein said filling of said depression with protective film comprises:
    depositing a layer of said protective film over said nitride layer; and
    recessing said protective film such that said protective film remains only in said depression.

14. The method of clam 13 wherein said protective film is an organic polymer and said recessing is effected with a plasma etch.

15. The method of claim 1 further comprising removing said protective film from said depression.

16. The method of claim 15 wherein said removing of said protective film is accomplished with a reactive ion etch.

17. A method of protecting a semiconductor shallow trench isolation (STI) oxide from etching, the method comprising:
    lowering, if necessary, the upper surface of said STI oxide to a level below that of adjacent silicon active areas;
    optionally depositing a silicon oxide layer over said STI oxide and adjacent silicon active areas effective in protecting said adjacent silicon active layers from stresses induced by a conformal nitride liner deposited thereon;

executing a chemical vapor deposition to deposit said conformal nitride liner upon said STI oxide and adjacent silicon active areas in a manner effective in defining a depression above said STI oxide;

covering said nitride liner with a protective film comprising an organic polymer;

recessing said protective film with a plasma etch, such that said protective film remains only in said depression;

removing said nitride layer from said adjacent active areas with a reactive ion etch; and removing said protective film from said depression with a plasma etch.

18. A method of protecting a semiconductor shallow trench isolation (STI) oxide from etching, the method comprising:

providing means for lowering, if necessary, the upper surface of said STI oxide to a level below that of adjacent silicon active areas;

providing means for depositing a conformal nitride liner upon said STI oxide and adjacent silicon active areas in a manner effective in defining a depression above said STI oxide providing means for protecting said adjacent silicon active areas from stresses induced b: said nitride liner;

providing means for filling said depression with a protective film;

providing means for removing said nitride layer from said adjacent active areas.

* * * * *